(12) United States Patent
Kim

(10) Patent No.: US 7,814,247 B2
(45) Date of Patent: Oct. 12, 2010

(54) PRE-FETCH CIRCUIT OF SEMICONDUCTOR MEMORY APPARATUS AND CONTROL METHOD OF THE SAME

(75) Inventor: Young-Ju Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 269 days.

(21) Appl. No.: 12/176,218

(22) Filed: Jul. 18, 2008

(65) Prior Publication Data

US 2009/0094440 A1 Apr. 9, 2009

(30) Foreign Application Priority Data

Oct. 9, 2007 (KR) ................... 10-2007-0101653

(51) Int. Cl.
*G06F 13/12* (2006.01)
*G06F 9/30* (2006.01)
(52) U.S. Cl. .................... 710/62; 712/207; 712/237; 711/213
(58) Field of Classification Search ............ 710/62–66; 711/213; 712/205–207, 233–237
See application file for complete search history.

(56) References Cited

U.S. PATENT DOCUMENTS

| 4,439,828 | A | * | 3/1984 | Martin | 712/226 |
|---|---|---|---|---|---|
| 5,410,674 | A | * | 4/1995 | Lawler | 710/66 |
| 6,909,643 | B2 | | 6/2005 | Kwean | |
| 7,200,069 | B2 | | 4/2007 | Jang et al. | |
| 7,224,625 | B2 | | 5/2007 | Dietrich et al. | |
| 7,243,254 | B1 | * | 7/2007 | Kuroodi et al. | 713/600 |
| 7,287,143 | B2 | | 10/2007 | Lee et al. | |
| 2008/0285374 | A1 | * | 11/2008 | Shin | 365/230.08 |
| 2009/0119492 | A1 | * | 5/2009 | Seal | 712/233 |

FOREIGN PATENT DOCUMENTS

| JP | 2000048599 | 2/2000 |
|---|---|---|
| JP | 2007-095252 | 4/2007 |
| KR | 1020010003995 A | 1/2001 |

* cited by examiner

*Primary Examiner*—Christopher B Shin
(74) *Attorney, Agent, or Firm*—Baker & McKenzie LLP

(57) ABSTRACT

A pre-fetch circuit of a semiconductor memory apparatus can carry out a high-frequency operating test through a low-frequency channel of a test equipment. The pre-fetch circuit of a semiconductor memory apparatus can includes: a pre-fetch unit for pre-fetching data bits in a first predetermined number; a plurality of registers provided in the first predetermined number, each of which latches a data in order or a data out of order of the pre-fetched data in response to different control signals; and a control unit for selectively activating the different control signals in response to a test mode signal, whereby some of the registers latch the data out of order.

19 Claims, 6 Drawing Sheets

PRE-FETCH CIRCUIT OF SEMICONDUCTOR MEMORY APPARATUS AND CONTROL METHOD OF THE SAME

CROSS-REFERENCES TO RELATED APPLICATION

The present application claims priority under 35 U.S.C. 119(a) to Korean application number 10-2007-0101653, filed on Oct. 9, 2007, the content of which is incorporated herein in its entirety by reference as if set forth in full.

BACKGROUND

1. Technical Field

The embodiments described herein relate to a semiconductor memory apparatus and, more particularly, to a pre-fetch circuit of a semiconductor memory apparatus and a control method of the same.

2. Related Art

Generally, a test equipment of a semiconductor memory apparatus can be classified into high-frequency channels, which are capable of supporting high-frequency signal processing, and low-frequency channels, which are not capable of supporting such the high-frequency signal processing.

The number of the high-frequency channels is far smaller than that of the low-frequency channels and most high-speed semiconductor memory apparatus are tested using the high-frequency channels.

The semiconductor memory apparatus uses a pre-fetch operation as a data processing method. In the case of a semiconductor memory apparatus using the pre-fetch operation, high-frequency channels are used for high-speed data processing in test equipment.

As shown in FIG. 1, a conventional pre-fetch circuit of a semiconductor memory apparatus includes a pre-fetch unit 10 and first to fourth registers 20 to 50.

Referring to FIG. 2, the pre-fetch unit 10 produces output data by pre-fetching input data on a four-bit unit basis in response to a DQ strobe signal "WDQS."

The first to fourth registers 20 to 50 respectively latch the pre-fetched four-bit data dinev0, dinod0, dinev1 and dinod1 according to data input strobe signal "dinstb" and then output the latched data to global data lines WGIOev0, WGIOod0, WGIOev1 and WGIOod1 which are respectively connected to them.

The conventional semiconductor memory apparatus has to use the high-frequency channels of the channels, which are provided to the test equipment at the time of testing the high-speed data processing, but the number of the high-frequency channels is smaller than that of the low-frequency channels.

Accordingly, the number of semiconductor memory apparatuses which can be test at once is limited to the number of the high-frequency channels provided by the test equipment and this limit in number causes a problem in that the testing efficiency is lowered.

SUMMARY

A pre-fetch circuit of a semiconductor memory apparatus capable of performing a high-frequency operating test through a low-frequency channel in a test equipment and a method for controlling the same is described herein.

According to one aspect, a pre-fetch circuit of a semiconductor memory apparatus can comprise: a pre-fetch unit that can be configured for pre-fetching data bits in a first predetermined number; a plurality of registers provided in the first predetermined number, each of which can be configured to latch a data in order or data out of order of the pre-fetched data, in response to different control signals; and a control unit that can be configured for selectively activating the different control signals in response to a test mode signal, whereby some of the registers latch the data out of order.

According to another aspect, a pre-fetch circuit of a semiconductor memory apparatus can comprise: a pre-fetch unit that can be configured for pre-fetching four-bit data; first to fourth registers each of which can be configured to latch a data in order or data out of order of the pre-fetched four-bit data in response to an even data strobe signal and an odd data strobe signal; and a control unit that can be configured for selectively activating the even data strobe signal and the odd data strobe signal in response to a test mode signal, whereby some of the first to fourth registers latch the data out of order.

According to still another embodiment, a method for controlling a pre-fetch circuit of a semiconductor memory apparatus can comprise the steps of: pre-fetching an input data; discriminating an activation of a test mode signal; and changing an order of the pre-fetched data and latching the data, which are changed in order of bits, in a plurality of registers when the test mode signal is activated.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

It will be clear that the embodiments described herein may be practiced without some or all of these specific details. In other instances, well known process operations have not been described in detail in order not to unnecessarily obscure the description of these embodiments.

The embodiments described herein improve the test efficiency of a test equipment by making it possible to achieve a high-frequency operating test through a low-frequency channel in a test equipment.

Figure 3:
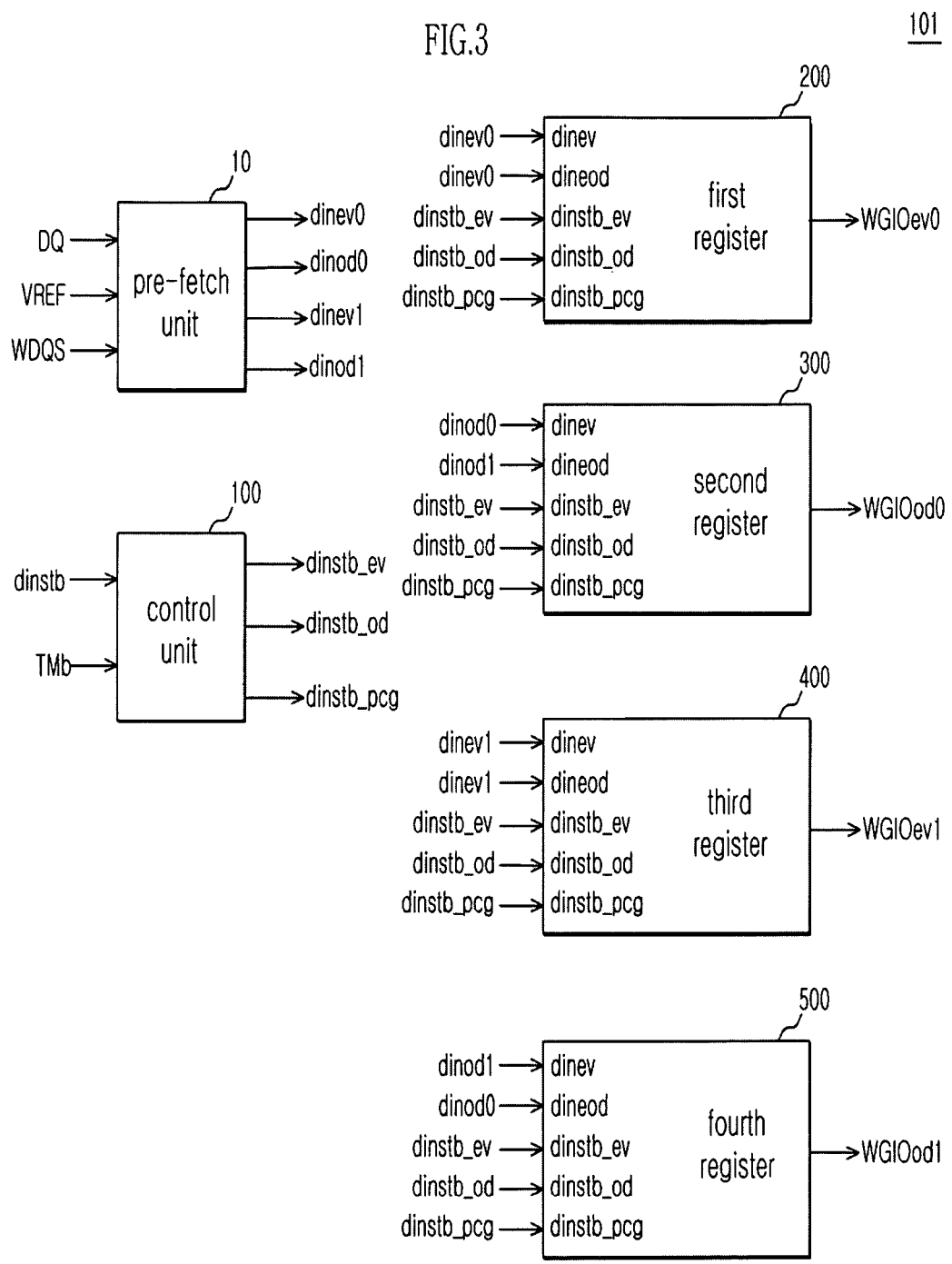
FIG. 3 is a block diagram illustrating a pre-fetch circuit of a semiconductor memory apparatus, in accordance with one embodiment.

FIG. 3 is a diagram illustrating an example pre-fetch circuit 11 according to one embodiment. Referring to FIG. 3, the pre-fetch circuit 11 of a semiconductor memory apparatus can include a pre-fetch unit 10, a control unit 100, and first to fourth registers 200 to 500.

Figure 1:
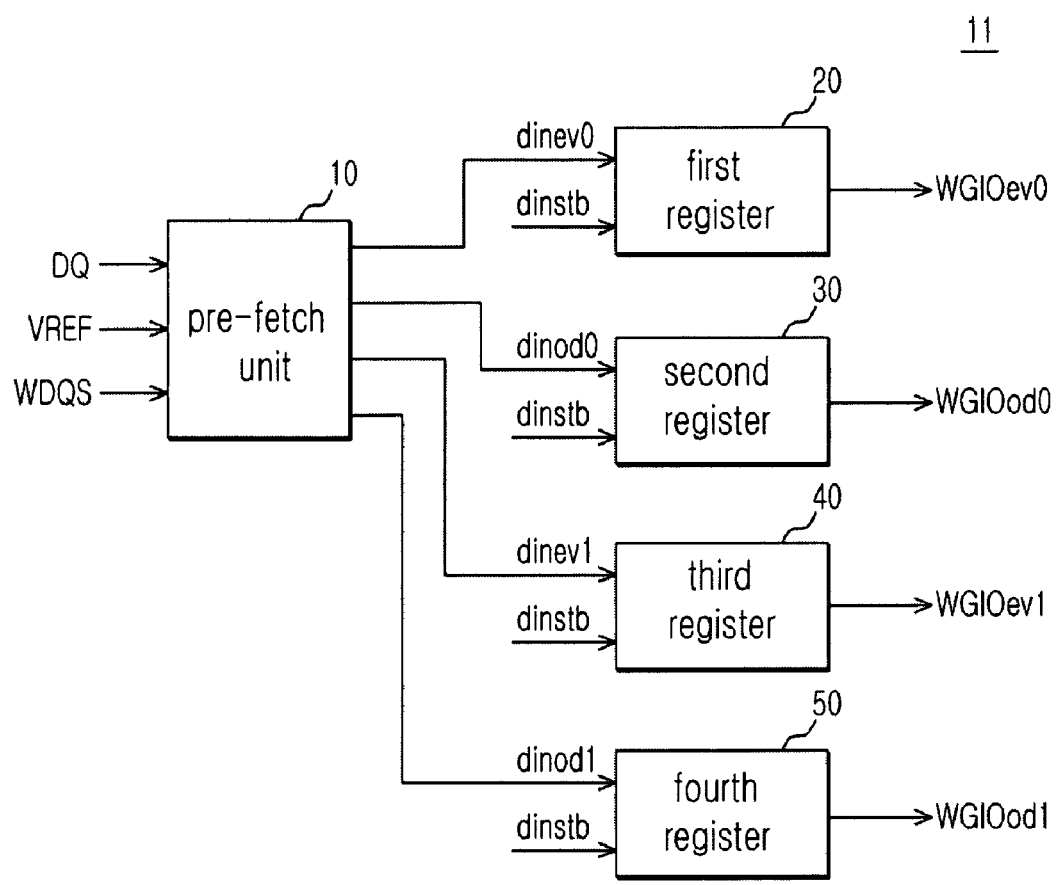
FIG. 1 is a block diagram illustrating a conventional pre-fetch circuit of a semiconductor memory apparatus.
Figure 2:
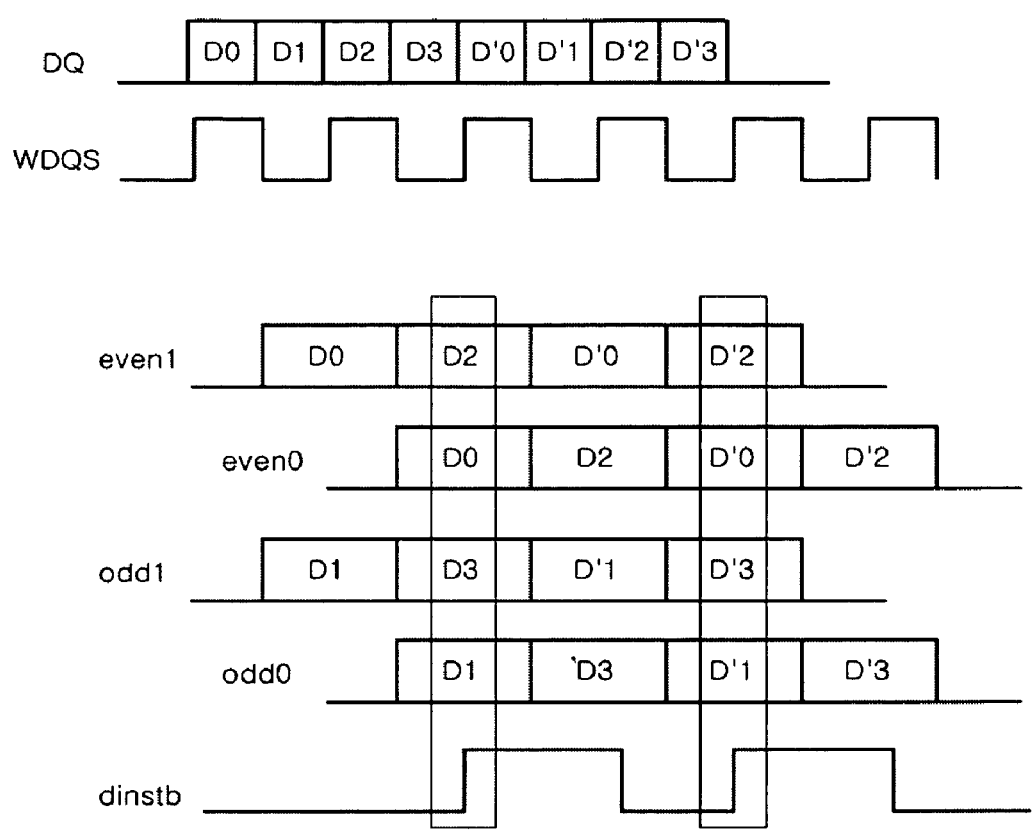
FIG. 2 is a timing chart illustrating the operation of a conventional data pre-fetch operation.

The pre-fetch unit 10 can be designed to pre-fetch four-bit data dinev0, dinod0, dinev1 and dinod1 and is the same as that of FIG. 1.

The first to fourth registers 200 to 500 can be configured to latch a corresponding data of the pre-fetched data dinev0, dinod0, dinev1 and dinod1 according to an even data strobe signal "dinstb_ev" and an odd data strobe signal "dinstb_od." The first to fourth registers 200 to 500 can be configured to latch the corresponding data in order or latch other data out of order.

The first register 200 can be configured to receive data in an order that is, a first-order data dinev0 through a first and a second input terminals dinev and dinod in common.

The second register 300 can be configured to receive data in an order that is a second-order data dinod0 through a first input terminal dinev and receive data out of order that is, and a fourth-order data dinod1 through a second input terminal dinod.

The third register 400 can be configured to receive data in an order that is, a third-order data dinev1 through a first and a second input terminals dinev and dinod in common.

The fourth register 500 can be configured to receive data in an order that is, the fourth-order data dinod1 through a first input terminal dinev and receive data out of order that is, the second-order data dinod0, out of order, through a second input terminal dinod.

The control unit 100 can be configured to produce an even data strobe signal "dinstb_ev," an odd data strobe signal "dinstb_od," and a precharge signal "dinstb_pcg" by combining the data strobe signal "dinstb" and a test mode signal "TM."

The control unit 100 can be configured to selectively activate the even data strobe signal "dinstb_ev" or the odd data strobe signal "dinstb_od" in order that each of the second register 300 and the fourth register 500 can latch other data out of order.

Figure 4:
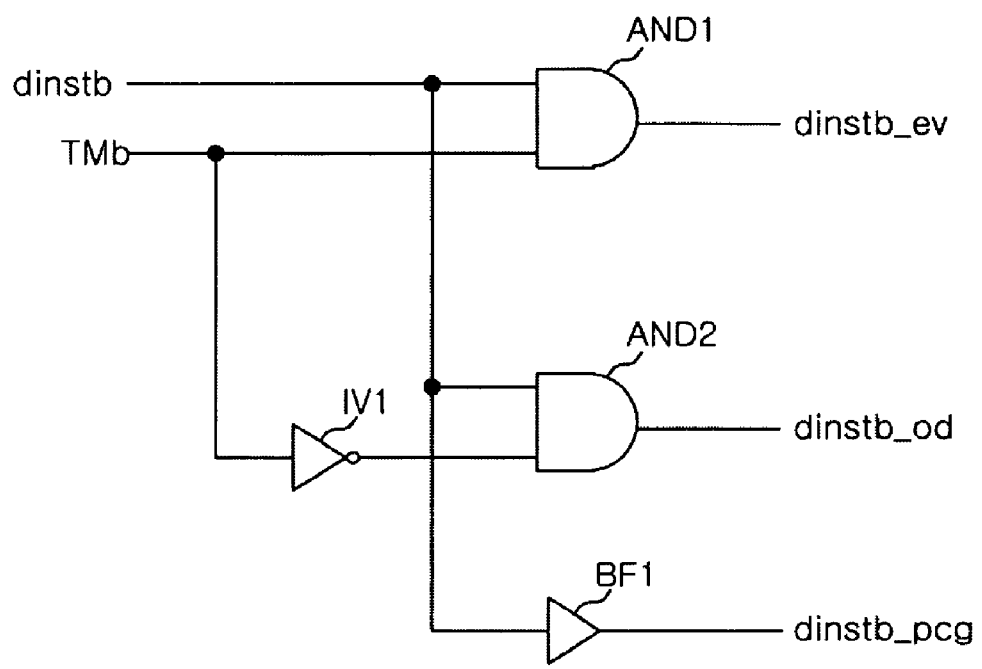
FIG. 4 is a circuit diagram illustrating a control unit included in the apparatus of FIG. 3, in accordance with one embodiment.

As shown in FIG. 4, the control unit 100 can include first and second AND gates AND1 and AND2, an inverter IV1 and a buffer BF1. The first AND gate AND1 can be configured to receive the data strobe signal "dinstb" and the test mode signal "TM" and then output the even data strobe signal "dinstb_ev." The inverter IV1 can be configured to receive the test mode signal "TM." The second AND gate AND2 can receive the data strobe signal "dinstb" and an output signal of the inverter "IV1" and then output the odd data strobe signal "dinstb_od." The buffer BF1 can be configured to receive the data strobe signal "dinstb" and then output the precharge signal "dinstb_pcg" which is matched with the output timing of the first and second AND gates AND1 and AND2.

Being different from a typical register, the first to fourth registers 200 to 500 can be configured to selectively receive two kinds of data. The first to fourth registers 200 to 500 can have the same configuration. Accordingly, only the first register 100 will be described in detail.

Figure 5:
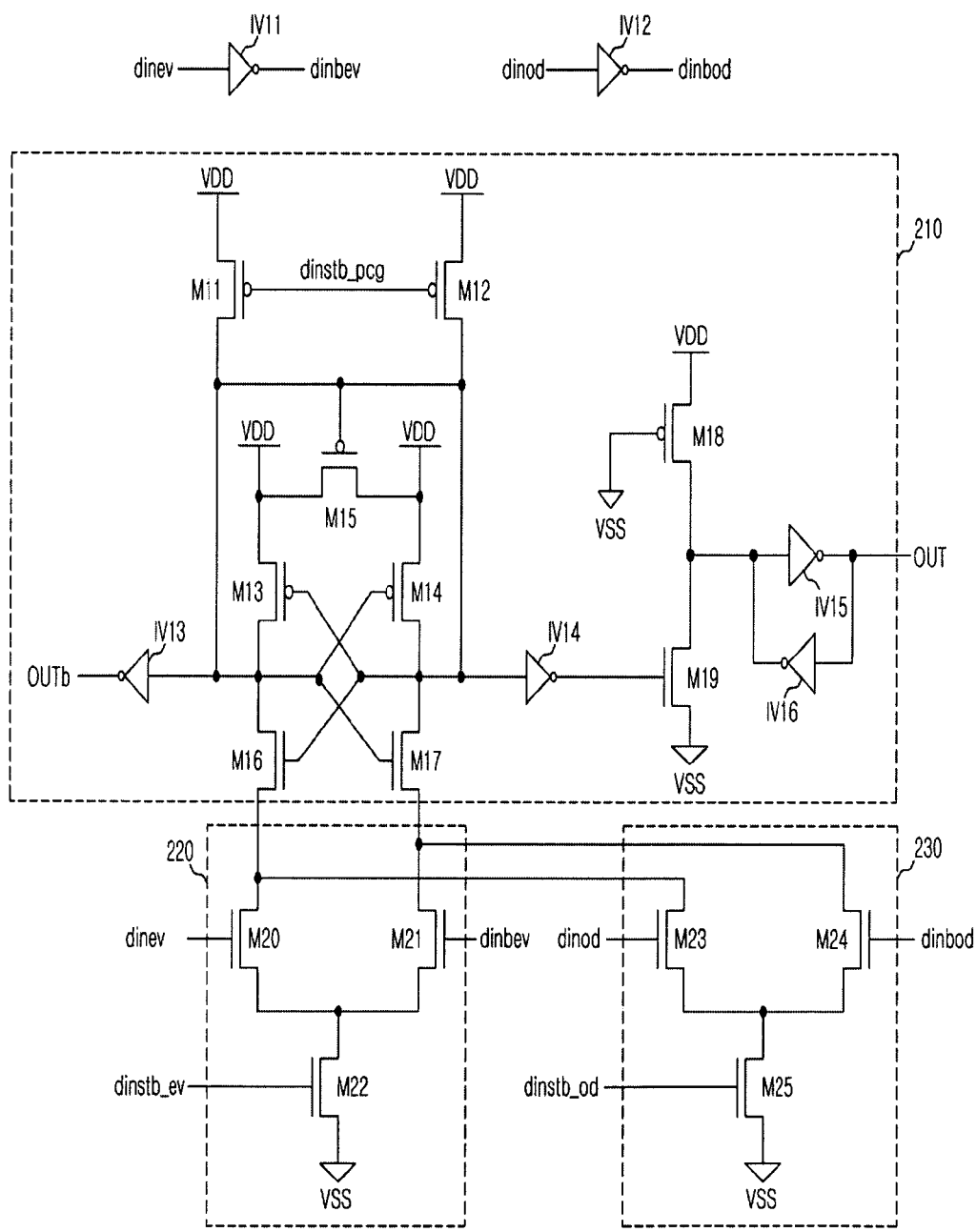
FIG. 5 is a circuit diagram illustrating a first register of included in the apparatus of FIG. 3, in accordance with one embodiment.

As shown in FIG. 5, the first register 200 can include first and second inverters IV11 and IV12, a latch circuit 210, a first input circuit 220, and a second input circuit 230. The first inverter IV11 can receive a signal of the first input terminal dinev and produces a differential signal for a first differential input terminal dinbev. The second inverter IV12 can receive a signal of the second input terminal dinod and produce a differential signal for a second differential input terminal dinbod.

The latch circuit 210 can include first to ninth transistors M11 to M19 and third to sixth inverter IV13 to IV16. The latch circuit 210 can be one of typical cross-coupled differential amplifiers. The first and second transistors M11 and M12 precharge output terminals of the latch circuit 210 to a power supply voltage VDD in response to the precharge signal "dinstb_pcg." The fifth and sixth inverters IV15 and IV16 have an output terminal of the latch circuit 210 maintained in a voltage level, which is taken before the precharge operation, although the output terminal of the latch circuit 210 can be precharged to the power supply voltage VDD in response to the precharge signal "dinstb_pcg."

The first input circuit 220 can include tenth to twelfth transistors M20 to M22. The tenth transistor M20 can have a gate which is connected to the first input terminal dinev. The eleventh transistor M21 can have a gate which is connected to the first differential input terminal dinbev. The twelfth transistor M22 can have a drain which is commonly connected to sources of the tenth and eleventh transistor M20 and M21, a source which is connected to a ground voltage, and a gate to which the even data strobe signal "dinstb_ev" is applied.

The second input circuit 230 can include thirteenth to fifteenth transistors M23 to M25. The thirteenth transistor M23 can have a gate which is connected to the second input terminal dinod. The fourteenth transistor M24 can have a gate which is connected to the second differential input terminal dinbod. The fifteenth transistor M25 can have a drain which is commonly connected to sources of the thirteenth and fourteenth transistor M23 and M24, a source which can be connected to the ground voltage, and a gate to which the odd data strobe signal "dinstb_od" is applied.

The operation of the pre-fetch circuit of the semiconductor memory apparatus will be described in detail.

First, the low-frequency data inputted through the low-frequency channel of the test equipment can be internally converted into the high-frequency data by the pre-fetch circuit.

Figure 6:
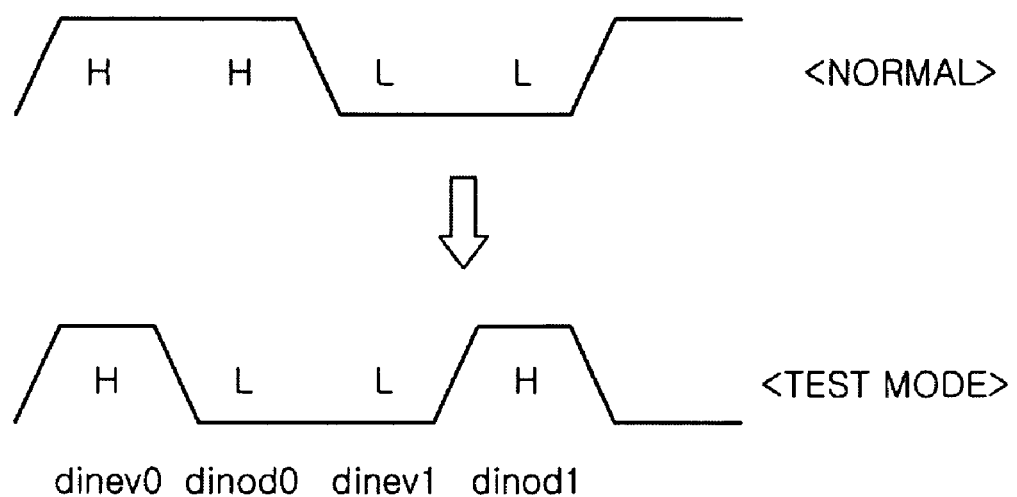
FIG. 6 is a timing chart illustrating the operation of a data pre-fetch operation, in accordance with one embodiment.

Referring to FIG. 6, a data pattern capable of supporting the low-frequency channel of the test equipment can have a repeated type in the first- to fourth-order data (dinev0=high level, dinod0=high level, dinev1=low level, and dinod1=low level) based on the 4-bit pre-fetch.

The pre-fetch circuit (operating in a test mode) can be configured to convert the low-frequency pattern into the high-frequency pattern which has a repeated type in the first- to fourth-order data (dinev0=high level, dinod0=low level, dinev1=low level, and dinod1=high level).

As shown in FIG. 6, for the conversion of the data pattern, the second-order data dinod0 can be changed into the fourth-order data dinod1 in a normal mode. To achieve such a change, the second register 300 can be configured to latch the second-order data dinod0 in the normal mode and latch the fourth-order data dinod1 in the test mode. Simultaneously, the fourth register 500 can be configured to latch the fourth-order data dinod1 in the normal mode and latch the second-order data dinod0 in the test mode. Furthermore, in order for the first and third registers 200 and 400 to latch the data, during normal operation in test mode, the first and second input terminals dinev and dinod of the first register 200 can be configured to commonly receive the first-order data idnev0 and the first and second input terminals dinev and dinod of the third register 400 can be configured to commonly receive the second-order data idnev1. Each of the first to fourth registers 200 to 500 can be configured to receive two-bit data and latches the two-bit data in different operating conditions (normal/test modes). Accordingly, an additional input circuit, the second input circuit 230, is required.

Hereinafter, the whole operation will be described in detail.

The pre-fetch unit 10 can be configured to pre-fetch and output the first—to fourth-order data dinev0 to dinod1.

In case of the normal mode, since the test mode signal "TMb" is inactivated in a high level, the even data strobe signal "dinstb_ev" can be activated in a high level and the odd strobe signal "dinstb_od" can be inactivated in a low level in the control unit 100 of FIG. 4.

Since the even data strobe signal "dinstb_ev" is activated, the first to fourth registers 200 to 500 can be configured to respectively latch the data in order through the first input circuit 220. The first register 200 can be configured to latch the first-order data dinev0, the second register 300 can be configured to latch the second-order data dinod0, the third register 400 can be configured to latch the third-order data dinev1, and the fourth register 500 can be configured to latch the fourth-order data dinod1.

In case of the test mode, since the test mode signal "TMb" is activated in a low level, the even data strobe signal "dinstb_ev" is inactivated in a low level and the odd strobe signal "dinstb_od" is activated in a high level in the control unit 100 of FIG. 4.

Since the odd data strobe signal "dinstb_od" is activated, the first and third registers 200 and 400 respectively can be configured to latch the data in order through the second input circuit 230. The first register 200 can be configured to latch the first-order data dinev0 and the third register 400 can be configured to latch the third-order data dinev1.

On the other hand, the second and fourth registers 300 and 500 can be configured to latch the data out of order. That is, the second register 300 can be configured to latch the fourth-order data dinod1 and the fourth register 500 can be configured to latch the second-order data dinod0.

Although the low-frequency data pattern is provided from the low-frequency channel of the test equipment, the semiconductor memory apparatus can convert the low-frequency data pattern into the high-frequency data pattern using the pre-fetch circuit so that the high-frequency data processing test can be substantially carried out.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A pre-fetch circuit of a semiconductor memory apparatus comprising:
   a pre-fetch unit configured to pre-fetch data in a first predetermined number;
   a plurality of registers provided in the first predetermined number, each of which is configured to latch data in order or data out of order of the pre-fetched data in response to different control signals; and
   a control unit configured to selectively activate the different control signals in response to a test mode signal, whereby some of the registers latch the data out of order.

2. The pre-fetch circuit of claim 1, wherein the registers, which latch the data in order of the pre-fetched data includes:
   a first input circuit configured to receive the data in order in response to an even data strobe signal of the different control signals;
   a second input circuit configured to receive the data in order in response to an odd data strobe signal of the different control signals; and
   a latch circuit configured to latch the data inputted from the first and second input circuits.

3. The pre-fetch circuit of claim 2, wherein the latch circuit is further configured to precharge an output terminal when the even odd data strobe signal and the odd data strobe signal are inactivated.

4. The pre-fetch circuit of claim 1, wherein the registers, which latch the data out of order of the pre-fetched data, include:
   a first input circuit configured to receive the data in order in response to an even data strobe signal of the different control signals;
   a second input circuit configured to receive the data out of order in response to an odd data strobe signal of the different control signals; and
   a latch circuit configured to latch data inputted from the first and second input circuits.

5. The pre-fetch circuit of claim 4, wherein the latch circuit is further configured to precharge an output terminal in response to a precharge signal when the even odd data strobe signal and the odd data strobe signal are inactivated.

6. The pre-fetch circuit of claim 1, wherein the control unit is further configured to produce the different control signals by combining a data strobe signal and a test mode signal using a plurality logic elements.

7. The pre-fetch circuit of claim 6, wherein the control unit is further configured to activate one of even data strobe signal and odd data strobe signal when the test mode signal is activated.

8. The pre-fetch circuit of claim 5, wherein the control unit includes a buffer configured to produce the precharge signal by buffering a data strobe signal.

9. A pre-fetch circuit of a semiconductor memory apparatus comprising:
   a pre-fetch unit configured to pre-fetch a first to fourth order data;
   first to fourth registers each of which are configured to latch data in order or data out of order of the first to fourth order data in response to an even data strobe signal and an odd data strobe signal; and
   a control unit configured to selectively activate the even data strobe signal and the odd data strobe signal in response to a test mode signal, whereby some of the first to fourth registers latch the data out of order.

10. The pre-fetch circuit of claim 9, wherein the first register includes:
    a first input circuit configured to receive the first-order data of the pre-fetched four-bit data in response to the even data strobe signal;
    a second input circuit configured to receive the first-order data in response to the odd data strobe signal; and
    a latch circuit configured to latch the data inputted from the first and second input circuits.

11. The pre-fetch circuit of claim 9, wherein the second register includes:
    a first input circuit configured to receive the second-order data of the pre-fetched four-bit data in response to the even data strobe signal;
    a second input circuit configured to receive the fourth-order data of the pre-fetched four-bit data in response to the odd data strobe signal; and
    a latch circuit configured to latch the data inputted from the first and second input circuits.

12. The pre-fetch circuit of claim 9, wherein the third register includes:
    a first input circuit configured to receive the third-order data of the pre-fetched four-bit data in response to the even data strobe signal;

a second input circuit configured to receive the third-order data in response to the odd data strobe signal; and a latch circuit configured to latch the data inputted from the first and second input circuits.

13. The pre-fetch circuit of claim 9, wherein the fourth register includes:

a first input circuit configured to receive the fourth-order data in response to the even data strobe signal;

a second input circuit configured to receive the second-order data in response to the odd data strobe signal; and a latch circuit configured to latch the data inputted from the first and second input circuits.

14. The pre-fetch circuit of claim 9, wherein the control unit is further configured to produce the even data strobe signal and the odd data strobe signal by combining a data strobe signal and a test mode signal using a plurality logic elements.

15. The pre-fetch circuit of claim 14, wherein the control unit is further configured to activate one of the even data strobe signal and the odd data strobe signal when the test mode signal is activated.

16. A method for controlling a pre-fetch circuit of a semiconductor memory apparatus comprising:

pre-fetching an input data;

discriminating an activation of a test mode signal; and changing an order of the pre-fetched data and latching the order changed data in a plurality of registers when the test mode signal is activated.

17. The method of claim 16, wherein some of the plurality of registers receive the data in order in response to an even data strobe signal and an odd data strobe signal.

18. The method of claim 17, wherein the rest of the plurality of registers receive the data in order in response to the even data strobe signal and receives a data out of order in response to the odd data strobe signal.

19. The method of claim 18, wherein the changing of the order of the pre-fetched data and latching the order changed data in a plurality of registers is carried out by inactivating the even data strobe signal and by activating the odd data strobe signal when the test mode signal is activated.

* * * * *